US011791126B2

(12) United States Patent
Likhanskii

(10) Patent No.: US 11,791,126 B2
(45) Date of Patent: Oct. 17, 2023

(54) APPARATUS FOR DIRECTIONAL PROCESSING

(71) Applicant: Applied Materials, Inc., Santa Clara, CA (US)

(72) Inventor: Alexandre Likhanskii, Middleton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 493 days.

(21) Appl. No.: 16/551,972

(22) Filed: Aug. 27, 2019

(65) Prior Publication Data

US 2021/0066023 A1    Mar. 4, 2021

(51) Int. Cl.
| H01J 37/16 | (2006.01) |
| H01J 37/305 | (2006.01) |
| H01J 37/20 | (2006.01) |
| H01J 37/08 | (2006.01) |

(52) U.S. Cl.
CPC .............. *H01J 37/16* (2013.01); *H01J 37/20* (2013.01); *H01J 37/3053* (2013.01); *H01J 37/08* (2013.01); *H01J 2237/022* (2013.01)

(58) Field of Classification Search
None
See application file for complete search history.

(56) References Cited

U.S. PATENT DOCUMENTS

| 6,214,183 | B1 * | 4/2001 | Maishev | H01J 37/3053 |
| | | | | 204/298.19 |
| 8,101,510 | B2 | 1/2012 | Godet et al. | |
| 8,992,740 | B2 * | 3/2015 | Hanyu | H01L 39/2461 |
| | | | | 204/192.24 |
| 2004/0222082 | A1 * | 11/2004 | Gopalraja | H01J 37/3053 |
| | | | | 204/298.26 |
| 2009/0020415 | A1 | 1/2009 | Gutkin et al. | |
| 2012/0104274 | A1 | 5/2012 | Hirayanagi et al. | |

(Continued)

FOREIGN PATENT DOCUMENTS

| CN | 103650098 A | 3/2014 |
| CN | 104299871 A | 1/2015 |

(Continued)

OTHER PUBLICATIONS

International Search Report and Written Opinion dated Nov. 17, 2020 in corresponding PCT application No. PCT/US2020/043879.

*Primary Examiner* — Ram N Kackar
(74) *Attorney, Agent, or Firm* — NIELDS, LEMACK & FRAME, LLC

(57) ABSTRACT

An apparatus for directional processing is disclosed. The apparatus includes a workpiece support and an ion source, having a plurality of walls. An extraction aperture is disposed on at least one of the plurality of walls. In certain embodiments, the plurality of walls defines a hollow region. The hollow region is located above the portion of the workpiece that is being processed, allowing the etching byproducts can be evacuated without depositing on the ion source. The shape of the hollow region may be modified to further reduce the amount of deposition on the hollow ion source. Additionally, a pump may be disposed within or above the hollow region to facilitate the removal of the etching byproducts. In other embodiments, the extraction aperture of the ion source may be disposed at a corner of the plasma chamber.

17 Claims, 10 Drawing Sheets

(56) References Cited

U.S. PATENT DOCUMENTS

| | | |
|---|---|---|
| 2013/0015053 A1 | 1/2013 | Benveniste et al. |
| 2013/0260544 A1 | 10/2013 | Koo et al. |
| 2014/0061501 A1 | 3/2014 | Sinha et al. |
| 2016/0071693 A1 | 3/2016 | Biloiu et al. |
| 2016/0163510 A1* | 6/2016 | Koo .................... H01J 37/3171 |
| | | 250/492.21 |
| 2016/0348232 A1* | 12/2016 | Chao ....................... C23C 14/46 |
| 2018/0068830 A1 | 3/2018 | Koo et al. |

FOREIGN PATENT DOCUMENTS

| | | | |
|---|---|---|---|
| EP | 2584583 A2 | 4/2013 | |
| JP | 2014-164142 * | 9/2014 | ............... G02B 5/30 |
| JP | 2015-526876 A | 9/2015 | |
| JP | 2017-533542 A | 11/2017 | |
| TW | 201824323 A | 7/2018 | |
| WO | 2011/007546 A1 | 1/2011 | |
| WO | 2017/083516 A1 | 5/2017 | |
| WO | 2018/048566 A1 | 3/2018 | |

* cited by examiner

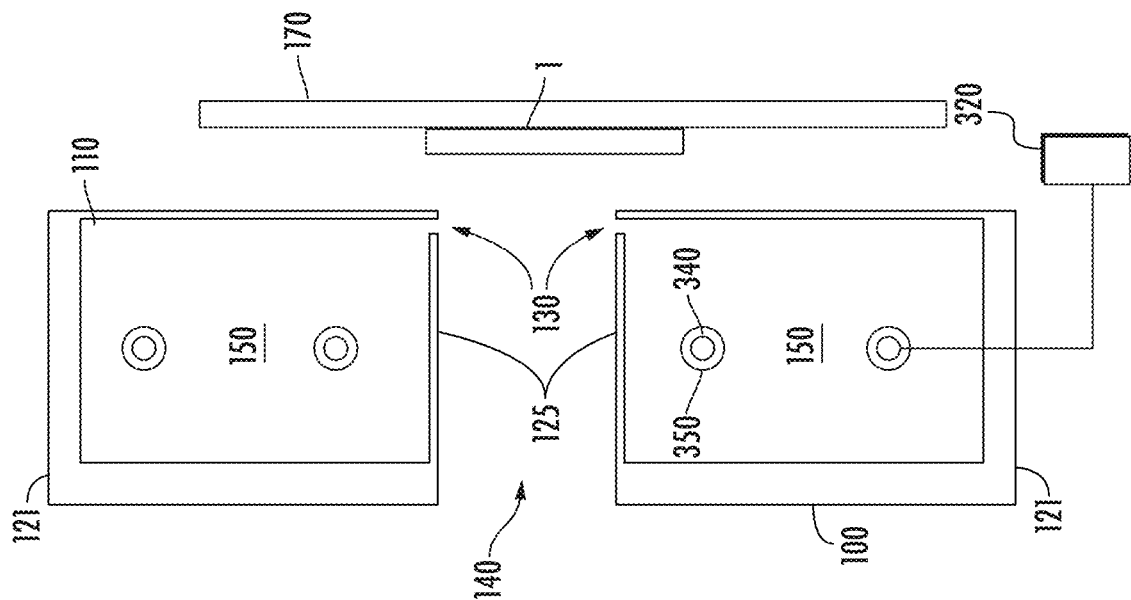
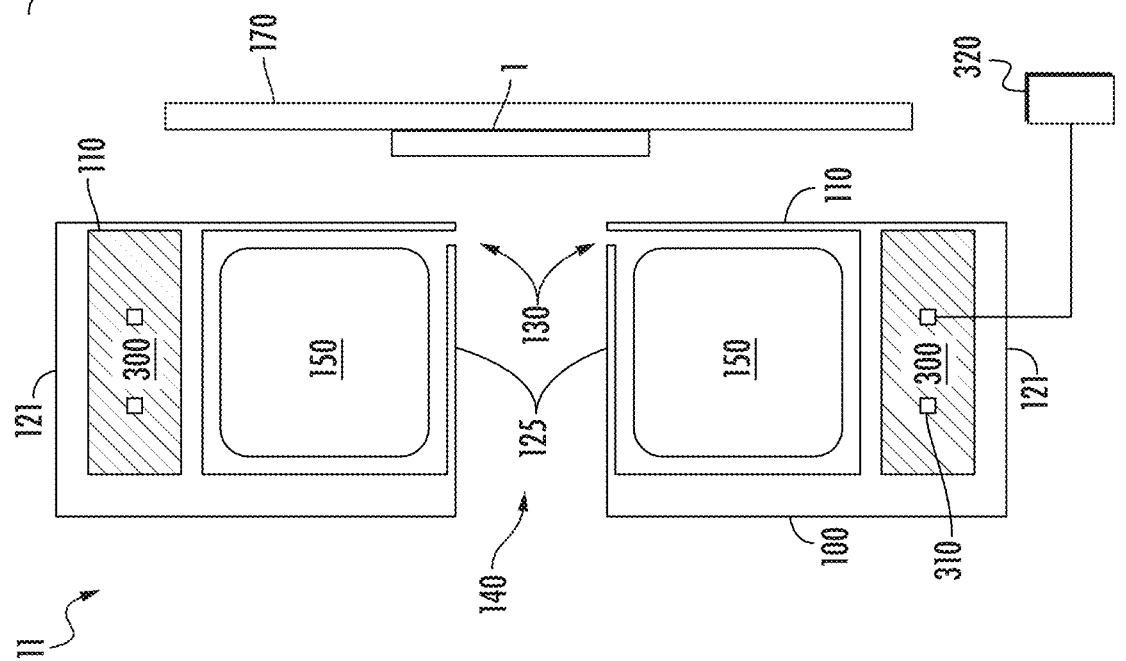

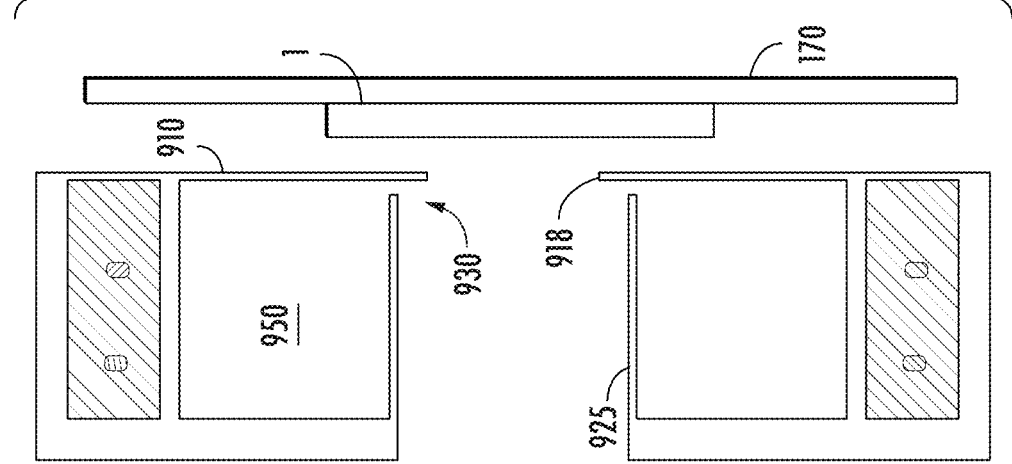
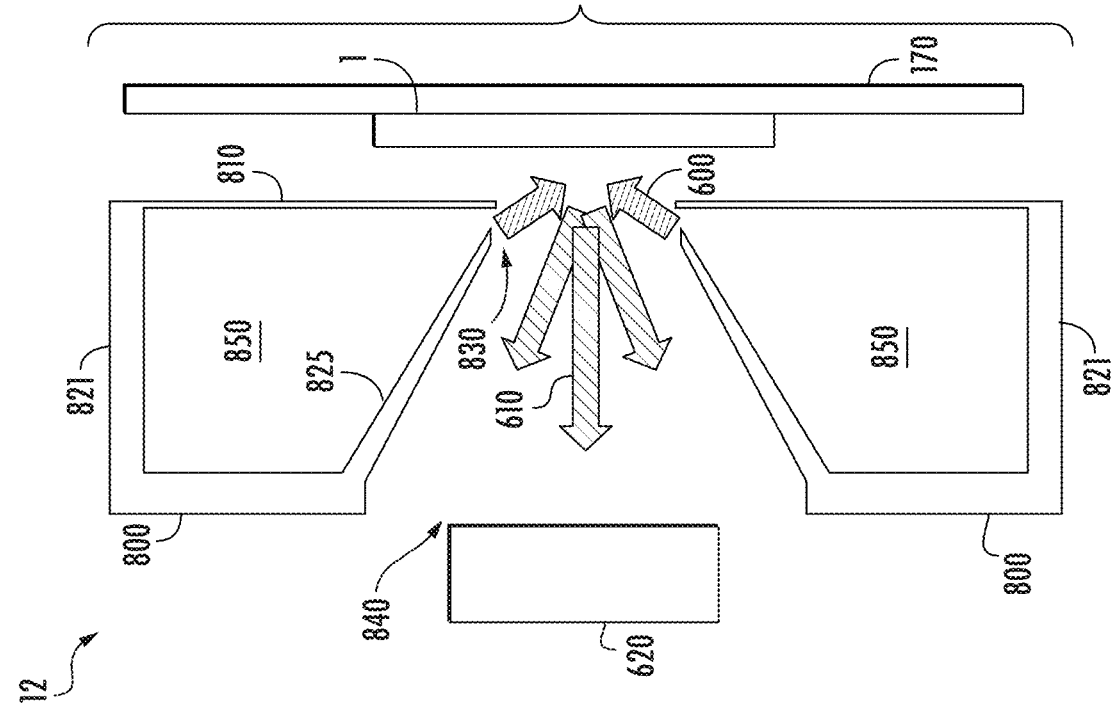

APPARATUS FOR DIRECTIONAL PROCESSING

FIELD

Embodiments of the present disclosure relate to an apparatus for directional processing and more particularly, to an ion source for directional processing.

BACKGROUND

The fabrication of a semiconductor device involves a plurality of discrete and complex processes. In some of these processes, it may be advantageous to strike the workpiece with ions that impact the workpiece at an angle that is not normal to the surface of the workpiece.

For example, in certain situations, etching processes may be performed at an angle that is not normal to the surface of the workpiece. This allows for etching of three-dimensional features, such as fins, sidewalls and other elements. Some semiconductor equipment that is used to perform these directional processes suffer drawbacks though.

In certain embodiments, the semiconductor equipment utilizes an extraction plate having an aperture that extracts ions at an angle. In these cases, the sputtering or etching process may cause the workpiece to release byproducts. Since the extraction plate is very close to the workpiece, these byproducts may become deposited on or near the extraction plate. Over time, the deposited byproducts may flake off from the extraction plate. These flakes may fall onto the workpiece, which contaminates the workpiece.

Additionally, some of these byproducts may be redeposited directly on the workpiece.

Furthermore, secondary electrons may be released from the workpiece due to the etching process. These secondary electrons may strike the extraction plate. The bombardment of these secondary electrons may heat the extraction plate, affecting the etch rate stability and uniformity. This is because etch rate is sensitive to temperature.

Therefore, it would be beneficial if there were an apparatus including an ion source that could perform directional processes, such as etching. Furthermore, it would be advantageous if the apparatus was designed such that etching byproducts did not adhere to the ion source and affect the etching process.

SUMMARY

An apparatus for directional processing is disclosed. The apparatus includes a workpiece support and an ion source, having a plurality of walls. An extraction aperture is disposed on at least one of the plurality of walls. In certain embodiments, the plurality of walls defines a hollow region. The hollow region is located above the portion of the workpiece that is being processed, allowing the etching byproducts can be evacuated without depositing on the ion source. The shape of the hollow region may be modified to further reduce the amount of deposition on the hollow ion source. Additionally, a pump may be disposed within or above the hollow region to facilitate the removal of the etching byproducts. In other embodiments, the extraction aperture of the ion source may be disposed at a corner of the plasma chamber.

According to one embodiment, an apparatus for performing a directional process on a workpiece is disclosed. The apparatus comprises a workpiece support for clamping the workpiece; an ion source having a plurality of walls that defines a plasma chamber, and having at least one of the plurality of walls that defines a first extraction aperture; wherein a portion of the plurality of walls define a hollow region of the ion source, and the hollow region defines a path for byproducts to flow away from the workpiece during the directional process. In certain embodiments, the first extraction aperture is disposed on one of the walls that defines the hollow region. In a further embodiment, wherein an ion beam is extracted through the first extraction aperture to perform the directional process on the workpiece, and wherein a pump or sputter catcher is positioned within or above the hollow region to pump byproducts of the directional process away from the workpiece. In certain embodiments, the ion source comprises a first wall comprising a first opening defined by first inner side edges and first inner end edges; a second wall comprising a second opening defined by second inner side edges and second inner end edges; outer walls connecting outer edges of the first wall and the second wall; interior end walls connecting the first inner end edges and the second inner end edges; two interior side walls extending from the first inner side edges toward the second wall, wherein at least one of the interior side walls does not extend to the second wall, creating the first extraction aperture disposed between the second wall and a bottom of the interior side wall. In a further embodiment, the first opening and the second opening have an equal width, and the interior side walls extend from the first wall toward the second wall in a direction perpendicular to the second wall. In another embodiment, the first opening is larger than the second opening in a width direction, and the interior side walls extend from the first wall toward the second wall in a direction perpendicular to the second wall, and wherein each of the second inner side edges extend beyond a plane of a respective interior side wall. In another embodiment, the first opening is larger than the second opening in a width direction and the interior side walls slope inward from the first inner side edges toward the second wall to further minimize redeposition of byproducts of the directional process on the interior side walls. In a further embodiment, each of the second inner side edges extend beyond a plane of a respective interior side wall. In certain embodiments, the two interior side walls do not extend to the second wall, such that there is a second extraction aperture, arranged parallel to the first extraction aperture and disposed proximate the hollow region so as to create two ion beams.

According to another embodiment, an apparatus for performing a directional process on a workpiece is disclosed. The apparatus comprises a workpiece support for clamping the workpiece; an ion source comprising a plurality of walls defining a plasma chamber, and an extraction aperture; wherein the plurality of walls comprises a first wall and a second wall, wherein the first wall is opposite the second wall, and the second wall is disposed closest to and parallel to the workpiece support in a processing position, and a plurality of side walls connecting the first wall and the second wall, wherein the extraction aperture is disposed on a side wall. In certain embodiments, the side wall that includes the extraction aperture is perpendicular to the second wall. In certain embodiments, the side wall that includes the extraction aperture forms an acute angle with the second wall. In certain embodiments, the second wall extends beyond the side wall that includes the extraction aperture. In certain embodiments, a pump or sputter catcher is disposed proximate the side wall that includes the extraction aperture.

According to another embodiment, apparatus for performing a directional process on a workpiece is disclosed. The apparatus comprises a workpiece support; and an ion source having a plurality of walls that define a plasma chamber; wherein an extraction aperture of the ion source is defined by at least one of the plurality of walls, and the extraction aperture is positioned at a corner of the plasma chamber proximate the workpiece support in a processing position. In certain embodiments, the extraction aperture at the corner of the plasma chamber provides a path for byproducts to flow away from the workpiece positioned on the workpiece support in the processing position. In certain embodiments, an ion beam is extracted through the extraction aperture to perform the directional process on the workpiece, and wherein a pump is positioned proximate the corner of the plasma chamber to pump byproducts of the directional process away from the workpiece. In certain embodiments, the plurality of walls comprises a first wall; and a second wall proximate the workpiece support when the workpiece support is in a processing position; a first sidewall having a first length extending from the first wall and ending at the corner; a second sidewall positioned opposite the first sidewall extending from the first wall to the second wall, the second sidewall having a second length; wherein the first length is less than the second length to define the extraction aperture at the corner between the first sidewall and the second wall. In a further embodiment, an ion beam is extracted through the extraction aperture and where the directional process is an etching process that creates etching byproducts from the workpiece. In certain embodiments, the apparatus comprises a pump to pump the etching byproducts away from the workpiece along a path created by the extraction aperture positioned at the corner of the plasma chamber.

BRIEF DESCRIPTION OF THE FIGURES

For a better understanding of the present disclosure, reference is made to the accompanying drawings, which are incorporated herein by reference and in which:

FIG. 5A is an apparatus for directional processing having a hollow ion source powered by a coil disposed inside the ion source according to one embodiment;

FIG. 5B is an apparatus for directional processing having a hollow ion source powered by a coil disposed inside the ion source according to another embodiment;

FIG. 8 is an apparatus for directional processing having a hollow ion source with sloped interior side walls according to one embodiment;

FIG. 9 shows an embodiment of the apparatus for directional processing where the second wall extends into a void;

DETAILED DESCRIPTION

As described above, in many applications, it is advantageous to perform an etching process using an angled ion beam. However, as stated above, there are drawbacks to currently available equipment.

Figure 1:
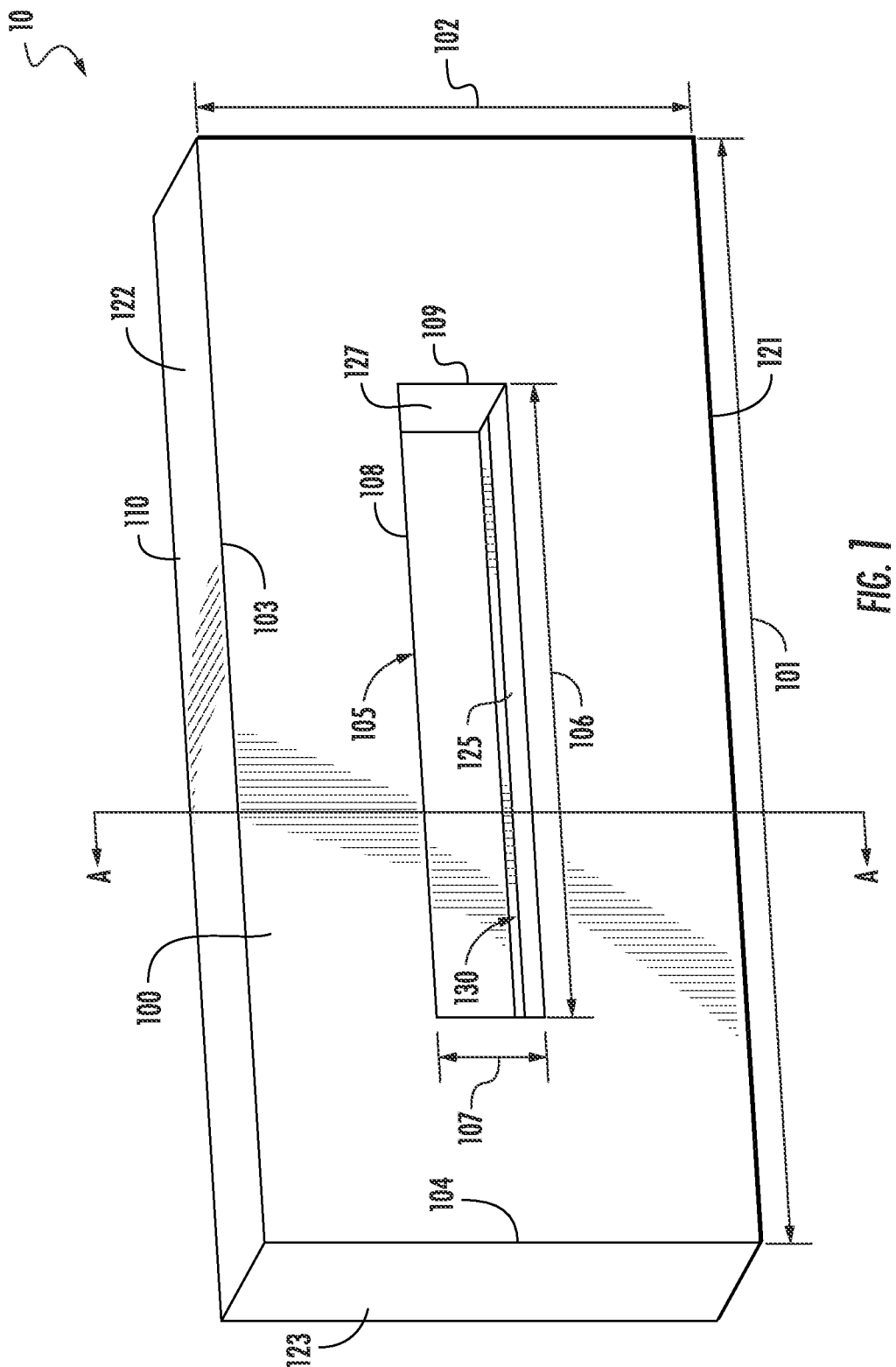
FIG. 1 is a first view of the hollow rectangular ion source according to one embodiment.

FIG. 1 shows a hollow ion source 10 according to one embodiment. In certain embodiments, the hollow ion source 10 may be a hollow rectangular ion source, wherein the outer edges of the ion source define a rectangular prism.

In this embodiment, the hollow ion source 10 comprises a first wall 100 and a second wall 110. The second wall 110 is defined as the bottom wall. Throughout this disclosure, the terms "top" and "bottom" are relative to the location of the workpiece support while in the processing position. For example, in certain embodiments, the workpiece support may be horizontal when in the processing position. In other embodiments, the workpiece support may be vertical when in the processing position. In all embodiment, the second wall 110 of the hollow ion source 10 is the wall closest to the workpiece support, when in the processing position. Typically, the second wall 110 is parallel to the workpiece support when in the processing position.

As shown in FIG. 1, the first wall 100 has a first outer perimeter, that is defined by a first outer length 101 and a first outer width 102. The first wall 100 also has a first opening 105, passing therethrough, proximate its center. The first opening 105 defines a first inner perimeter, having a first inner length 106 and a first inner width 107. The first inner length 106 is less than the first outer length 101 and the first inner width 107 is less than the first outer width 102. In certain embodiments, the geometric center of the first opening 105 is the same as the geometric center of the first wall 100.

In certain embodiments, the first outer perimeter of the first wall 100 defines a rectangle. In this case, the first outer perimeter comprises two edges in the width direction, referred to as first outer end edges 104, and two edges in the length direction, referred to as first outer side edges 103.

However, in certain embodiments, the first outer perimeter may be a different shape, such as an oval. In this embodiment, the first outer perimeter comprises two curved edges in the width direction, referred to as first outer end edges, and two edges in the length direction, referred to as first outer side edges.

In certain embodiments, the first inner perimeter of the first wall 100 defines a rectangle. In this case, the first inner perimeter comprises two edges in the width direction, referred to as first inner end edges 109, and two edges in the length direction, referred to as first inner side edges 108.

However, in certain embodiments, the first inner perimeter may be a different shape, such as an oval. In this embodiment, the first inner perimeter comprises two curved edges in the width direction, referred to as first inner end edges, and two edges in the length direction, referred to as first inner side edges. In certain embodiments, the first inner side edges are parallel to one another.

Figure 2:
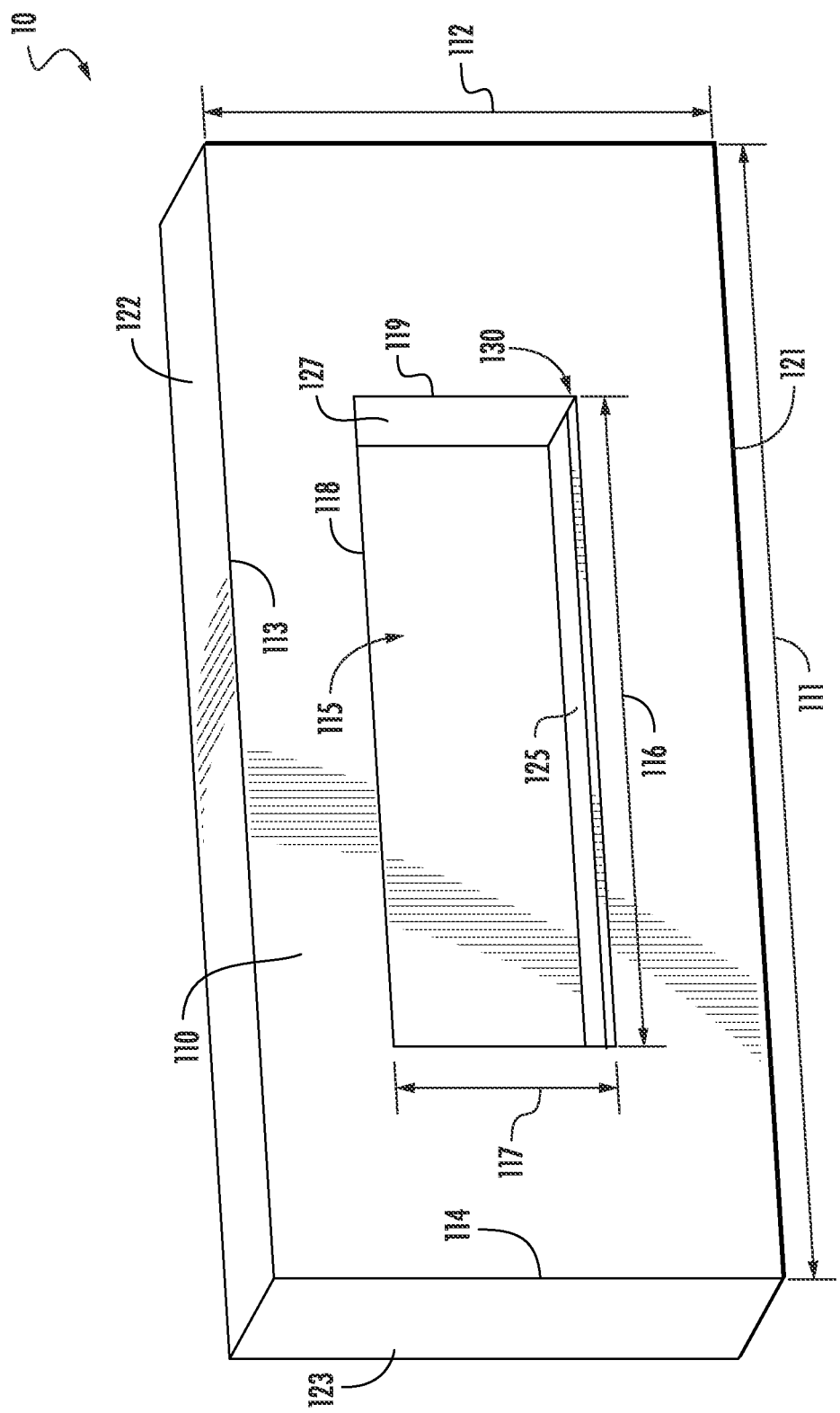
FIG. 2 is a second view of the hollow rectangular ion source of FIG. 1 according to one embodiment.

As shown in FIG. 2, the second wall 110 has a second outer perimeter, that is defined by a second outer length 111 and a second outer width 112. The second wall 110 also has a second opening 115, passing therethrough, proximate its center. The second opening 115 defines a second inner perimeter, having a second inner length 116 and a second inner width 117. The second inner length 116 is less than the second outer length 111 and the second inner width 117 is less than the second outer width 112. In certain embodiments, the geometric center of the second opening 115 is the same as the geometric center of the second wall 110.

In certain embodiments, the second outer perimeter of the second wall 110 defines a rectangle. In this case, the second outer perimeter comprises two edges in the width direction, referred to as second outer end edges 114, and two edges in the length direction, referred to as second outer side edges 113.

However, in certain embodiments, the second outer perimeter may be a different shape, such as an oval. In this embodiment, the second outer perimeter comprises two curved edges in the width direction, referred to as second outer end edges, and two edges in the length direction, referred to as second outer side edges.

In certain embodiments, the second inner perimeter of the second wall 110 defines a rectangle. In this case, the second inner perimeter comprises two edges in the width direction, referred to as second inner end edges 119, and two edges in the length direction, referred to as second inner side edges 118.

However, in certain embodiments, the second inner perimeter may be a different shape, such as an oval. In this embodiment, the second inner perimeter comprises two curved edges in the width direction, referred to as second inner end edges, and two edges in the length direction, referred to as second inner side edges. In certain embodiments, the second inner side edges are parallel to one another.

In some embodiments, the first outer perimeter and the second outer perimeter are identical. In other words, if the first outer perimeter is a rectangular having a length and a width, the second outer perimeter is also a rectangle having the same length and width. In this embodiment, the outer surfaces of the ion source form a rectangular prism. Likewise, if the first outer perimeter forms an oval, the second outer perimeter also defines an oval having the same dimensions.

Outer walls 121 are used to connect the first wall 100 and the second wall 110. In certain embodiments, the outer walls 121 are located at the outer edges of the first wall 100 and the second wall 110. The outer walls 121 may be categorized as outer side walls 122 and outer end walls 123. For example, outer side walls 122 may be used to connect two first outer side edges 103 to the two second outer side edges 113. Outer end walls 123 may be used to connect the two first outer end edges 104 to the two second outer end edges 114. In certain embodiments, the first wall 100 and second wall 110 may be parallel to each other, such that the outer walls 121 are all the same height. The outer walls 121 form an air tight seal with the first wall 100 and the second wall 110 such that gas cannot escape between the outer walls 121 and the first wall 100 or second wall 110.

Interior end walls 127 are used to connect the two first inner end edges 109 to the two second inner end edges 119. The interior end walls 127 are connected to both the first wall 100 and the second wall 110 such that there are no apertures along the interior end walls.

Figure 3B:
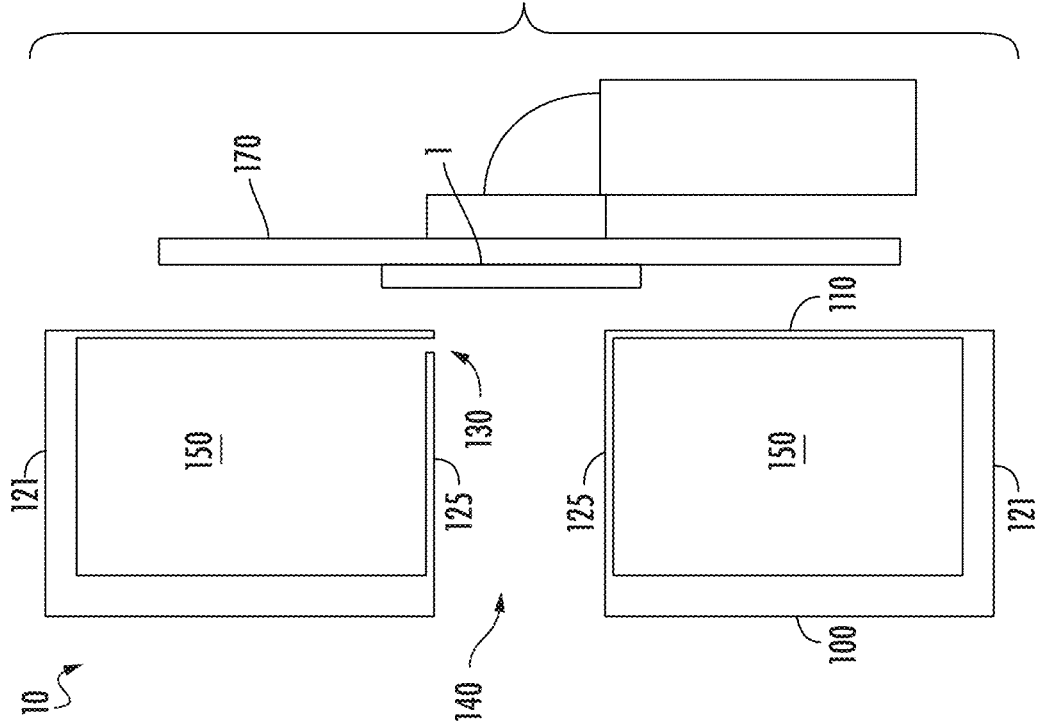
FIG. 3B is a cross-sectional view of the hollow rectangular ion source of FIG. 1 taken along line A-A according to another embodiment.
Figure 3A:
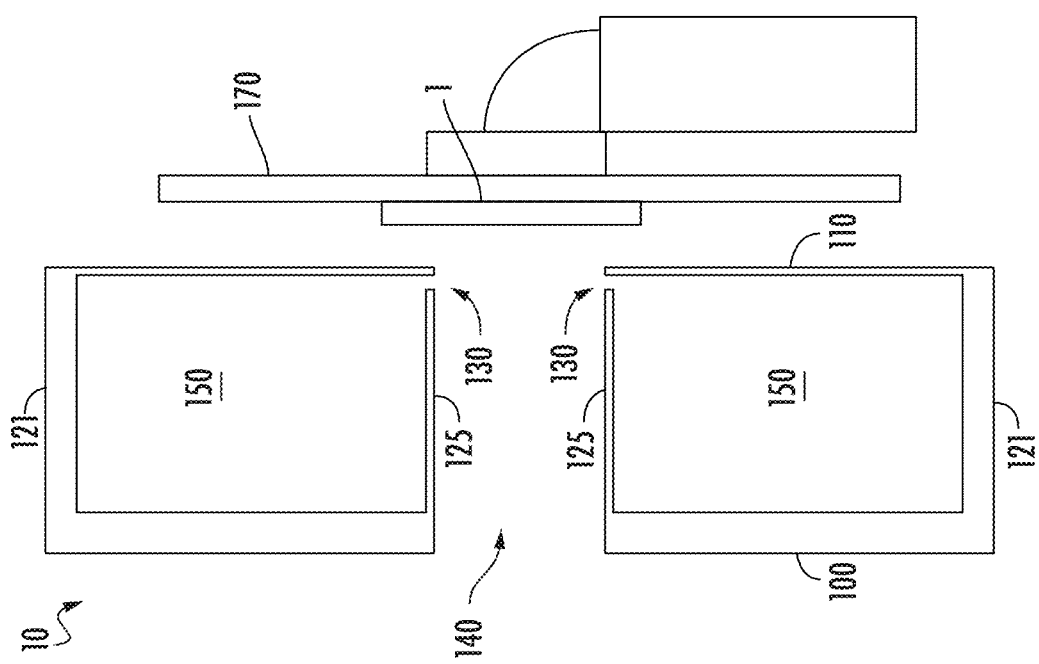
FIG. 3A is a cross-sectional view of the hollow rectangular ion source of FIG. 1 taken along line A-A according to one embodiment.

FIGS. 3A-3B show a cross-sectional view of the hollow ion source 10 taken along line A-A according to two embodiments. The workpiece 1 is disposed on a conductive surface, such as a workpiece support 170, which is negatively biased relative to the hollow ion source 10. In certain embodiments, the workpiece support 170 is horizontal when a workpiece is being loaded onto it. This is referred to as the loading position. The workpiece support 170 then clamps the workpiece 1, such as by using electric fields. Once the workpiece 1 is clamped, the workpiece support 170 may rotate to a processing position, which may be vertical.

The workpiece support 170, when in the processing position, is disposed proximate and parallel to the second wall 110. As explained above, the workpiece support 170 may be vertical or horizontal when in the processing position.

As shown in FIGS. 3A-3B, interior side walls 125 extend from the two first inner side edges 108 of the first wall 100 toward the second wall 110. The interior end walls 127 and the interior side walls 125 define a hollow region 140.

One or both of the interior side walls 125 do not extend all the way from the first wall 100 to the second wall 110. Thus, extraction apertures 130 may be created between the second wall 110 and the lower edge of the interior side walls 125 on the two sides of the hollow region 140. In certain embodiments, an extraction aperture 130 is created on each side of the hollow region 140, as shown in FIG. 3A. In another embodiment, only one of the two sides of the hollow region 140 may have an extraction aperture 130, as shown in FIG. 3B. Thus, unlike conventional processing equipment, the extraction apertures 130 in the present system are not disposed on the second wall 110, which is the wall that is closest to the workpiece 1 and the workpiece support 170. Rather, the extraction apertures 130 are disposed in the interior side walls 125. This allows the beam angle mean to be greater than would otherwise be possible.

Further, in certain embodiments, the extraction aperture 130 is disposed at a corner of the hollow ion source 10. In this disclosure, the term "corner" refers to the region proximate the intersection of the planes of two walls of the hollow ion source 10. For example, as shown in FIGS. 3A-3B, the extraction aperture 130 is disposed in the region proximate the intersection of the plane of the second wall 110 and the plane of the interior side wall 125. In some embodiments, the corner is a region that is proximate the intersection of the second wall 110 and the plane of one other wall. Specifically, in these embodiments, the one other wall terminates prior to contacting the second wall 110. This creates a gap between the one other wall and the second wall 110. This gap is the extraction aperture and the region in which the gap exists is defined as the corner of the plasma chamber. Stated differently, the second wall 110 and the plane of the one other wall intersect in a line. This line is referred to as the corner of the plasma chamber. The aperture is created on the one other wall, such that the one other wall does not contact the second wall 110. In another embodiment, the second wall 110 and the one other wall both terminate prior to the intersection of the two planes such that a gap exists between the second wall 110 and the one other wall.

In certain embodiments, the first opening 105 and the second opening 115 have the same width, and the interior side walls 125 extend downward from the first inner side edges 108 toward the second inner side edges 118 in a direction that is perpendicular to the first wall 100 and the second wall 110.

In certain embodiments, the first opening 105 and the second opening 115 have the same length, and the interior end walls 127 extend downward from the first inner end edges 109 toward the second inner end edges 119 in a direction that is perpendicular to the first wall 100 and the second wall 110.

As can be seen in FIG. 2 and FIGS. 3A-3B, the interior end walls 127 and interior side walls 125 create a hollow region 140 within the hollow ion source 10. A plasma chamber 150 is defined as a volume between the outer walls 121, the interior side walls 125, the interior end walls 127, the first wall 100 and the second wall 110.

While FIGS. 1 and 2 show a single volume created by the outer walls 121, the interior side walls 125, the interior end walls 127, the first wall 100 and the second wall 110, other embodiments are possible. For example, the first opening 105 may have a first inner length 106 that is substantially the same as the first outer length 101. Similarly, the second opening 115 may have a second inner length 116 that is substantially the same as the second outer length 111. In this way, two separate volumes are created; one on each side of the hollow region 140. Each of these separate volumes may be energized so as to create two separate plasma chambers 150.

The hollow region 140 is separated from the plasma chamber by the interior side walls 125 and the interior end walls 127. The extraction apertures 130 provide the opening through which ions that are generated within the plasma chamber 150 may exit the hollow ion source 10. Note that due to the position of the extraction aperture 130, the ions that are extracted from the plasma chamber 150 travel through the hollow region 140 toward the workpiece support 170.

While FIGS. 3A-3B show the interior side walls 125 and the outer walls 121 creating sharp edges with the first wall 100 and the second wall 110, it is also possible that the edges are rounded.

In certain embodiments, there are two extraction apertures 130 and these extraction apertures are parallel to one another and are exactly the same height and length. Further, the extraction apertures 130 may be parallel to and equidistant from the respective outer side wall 122. In this way, the plasma chamber 150 is the same size on both sides of the hollow ion source 10. This may allow better uniformity and consistency in the two ion beams that are extracted through the two extraction apertures 130.

In another embodiment, the extraction apertures 130 may be different heights and/or lengths.

Having defined the physical structure of the hollow ion source 10, a description of the plasma source is now provided. The choice of plasma source is not limited by this disclosure.

Figure 4:
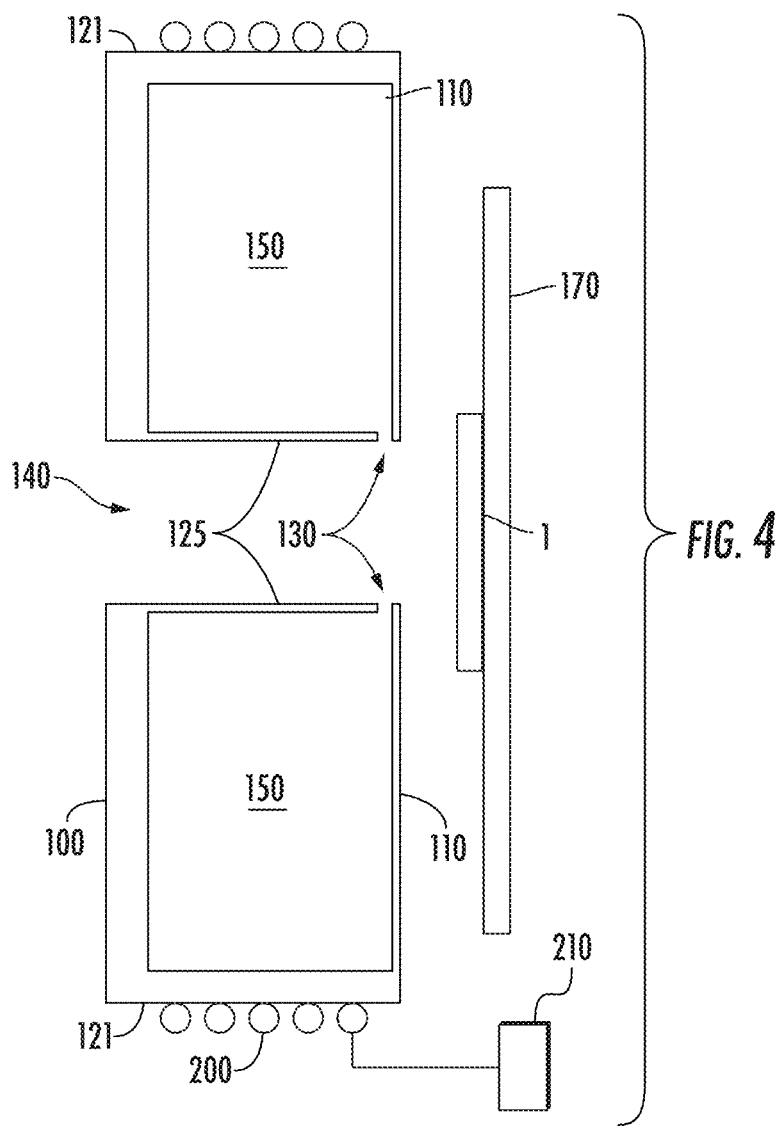
FIG. 4 is an apparatus for directional processing having a hollow ion source powered by an antenna disposed outside the ion source according to one embodiment.

For example, in one embodiment, an antenna 200 may be disposed against one or more of the outer walls 121, as shown in FIG. 4. In certain embodiments, the antenna 200 is disposed against the two outer side walls 122. In other embodiments, the antenna is disposed against the two outer side walls 122 and the two outer end walls 123. This antenna 200 may be in electrical communication with a RF power supply 210, to supply an RF signal to the antenna 200. In this embodiment, one or more of the outer walls 121 may be constructed from a dielectric material to allow the energy from the antenna 200 to enter the plasma chamber 150.

In another embodiment, shown in FIG. 5A, the interior of the hollow ion source 11 is divided into two parts; a housing 300 and the plasma chamber 150. One or more coils 310 are wound in the housing 300 such that the coils 310 surround the plasma chamber 150. In other words, housing 300 exists proximate all of the outer walls 121, and the coils 310 are configured to travel in a path that is approximately along the outer walls 121. These coils 310 are in communication with a power supply 320 and produces an inductively coupled plasma (ICP).

In yet another embodiment, the antenna is disposed within the plasma chamber 150, as shown in FIG. 5B. The one or more coils 340 are disposed within the plasma chamber 150. In certain embodiments, the coils 340 are disposed within and spaced apart from a quartz tube 350 to electrically isolate it from the plasma. The coils 340 may be in communication with a power supply 320.

As noted above, other plasma sources may also be used with the hollow ion source. For example, an electron beam plasma source, an indirectly heated cathode, or a Bernas source may be utilized.

Figure 6:
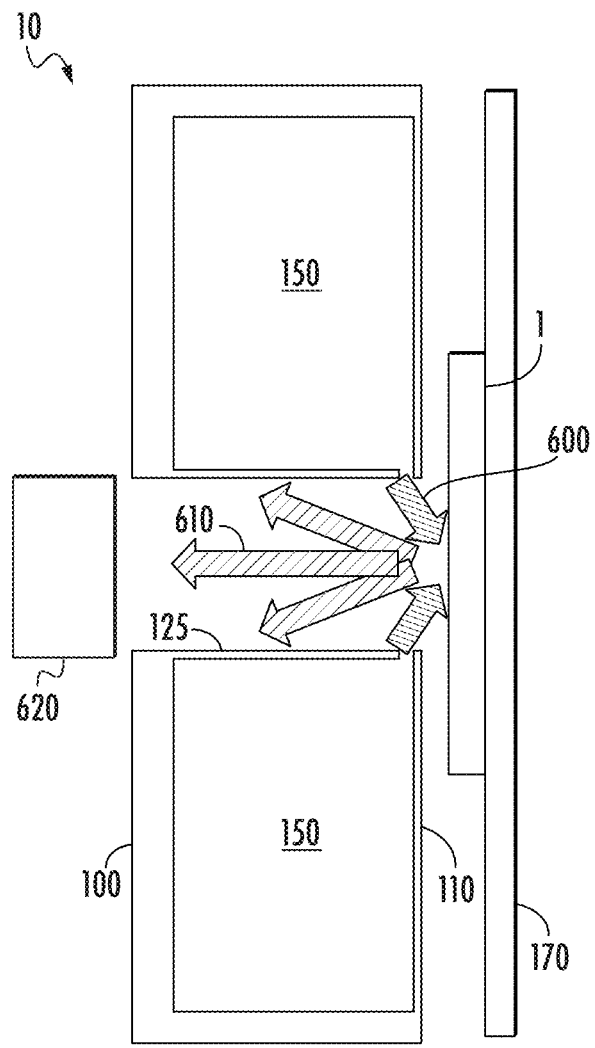
FIG. 6 shows the operation of the apparatus for directional processing, including the flow of ions and etching byproducts.

FIG. 6 shows the operation of the hollow ion source 10. A feed gas is supplied to the plasma chamber 150 from a gas inlet disposed on either the outer walls 121 or the first wall 100. This feed gas may be any suitable species, such as an etching gas, including but not limited to argon, $CF_4$, $CHF_3$, $CH_3F$, $O_2$, Kr, or $CH_4$. Alternatively, an ion implantation species may be used. As described above, a plasma source is used to create a plasma in the plasma chamber 150. The workpiece 1 is disposed parallel to and spaced apart from the second wall 110 of the hollow ion source. The workpiece 1 is disposed on a conductive surface, such as a workpiece support 170, which is negatively biased relative to the hollow ion source 10. In this way, the positive ions within the plasma chamber 150 are attracted to the workpiece 1. The ions 600 are drawn through extraction apertures 130, in the form of collimated ribbon ion beams, and are directed toward the workpiece 1 at an angle. The ions 600 travel through the hollow region 140 toward the workpiece 1. As shown in the Figure, the angle at which the ions travel toward the workpiece 1 is different than normal to the workpiece surface. As the ions 600 strike the workpiece 1, etching byproducts 610 may be released from the workpiece 1. These etching byproducts 610 that are released by the etching process drift into the hollow region 140. In this way, the etching byproducts 610 do not deposit on the second wall 110 of the hollow ion source 10.

The inclusion of a hollow region 140 significantly increases gas conductance for the hollow ion source 10, as compared to other semiconductor equipment. This may allow operation at higher gas flows, but remaining at low pressure, to improve the ion to radical ratio.

To more completely remove the etching byproducts 610, a pump 620 may be disposed within the hollow region 140. The pump 620 may create a negative pressure that draws the etching byproducts 610 through the hollow region 140 and into the pump 620. Alternatively, a sputter catcher may be employed. A sputter catcher is a device at the same potential as the workpiece 1 having a concave shape, such that sputtered material enters the sputter catcher but cannot exit. In certain embodiments, the sputter catcher may include a mesh-like material or a porous foam that allows the sputter material to enter the sputter catcher, but then retains the sputter material. These components may minimize the amount of etching byproducts 610 that are deposited on the surface of the interior side walls 125.

Figure 7:
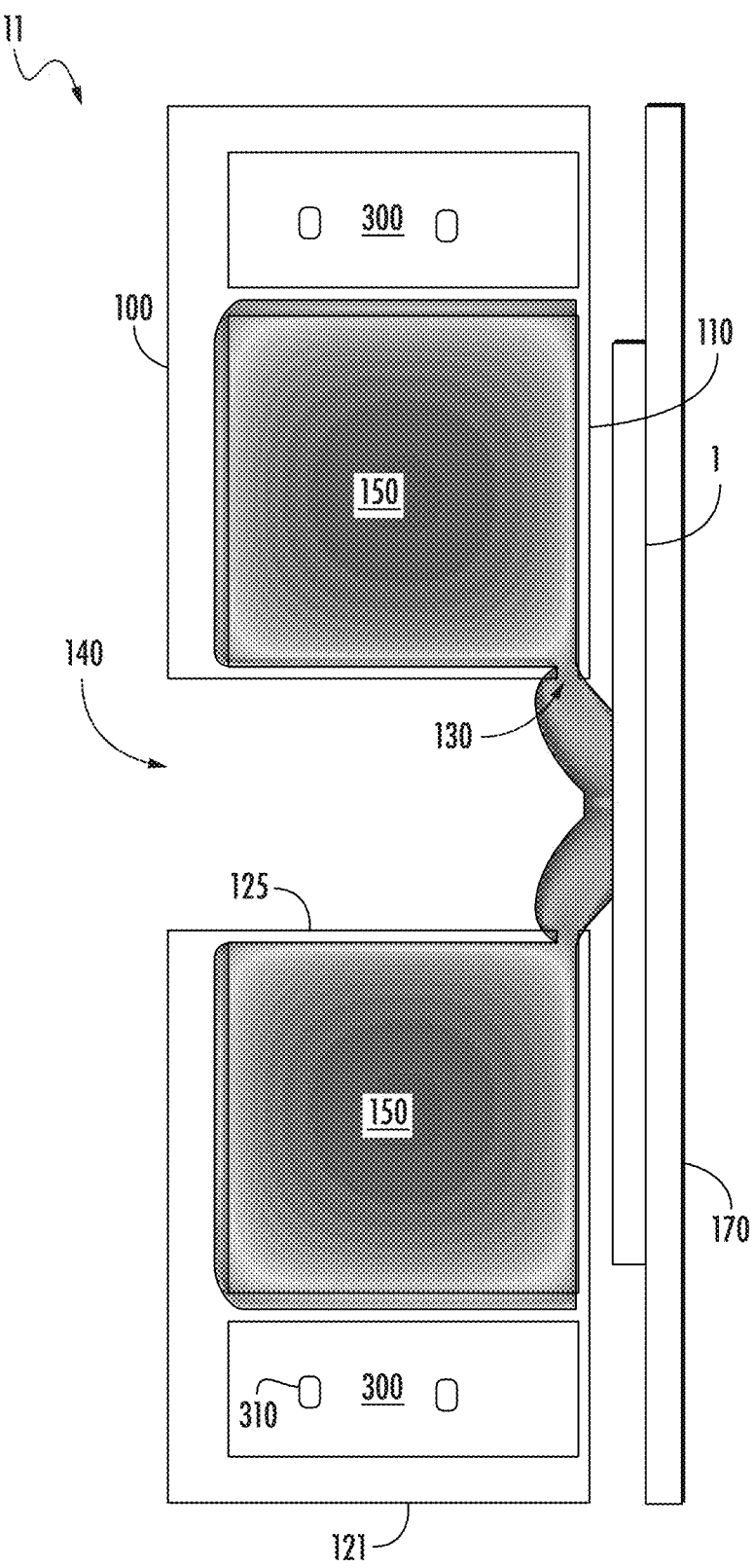
FIG. 7 shows the plasma concentration in the apparatus of FIG. 5.

FIG. 7 shows the plasma concentration when the hollow ion source 11 of FIG. 5 is in operation. Plasma is generated in the plasma chamber 150. Additionally, plasma exits through the extraction aperture 130 and is directed toward the workpiece 1, such that the ions strike the workpiece 1 at an angle that is not normal to the plane of the workpiece 1. Note that the portion of the workpiece 1 that is being etched is located proximate the hollow region 140, rather than adjacent to the second wall 110. This allows the etching byproducts to exit through the hollow region 140 without depositing on the walls of the hollow ion source 11.

Tests were performed using the hollow ion source 11 of FIG. 7. In all of these tests, an argon plasma was created within the plasma chamber 150.

In one test, the height of the extraction aperture 130 was set to 6 mm, and the workpiece support 170 was biased at 2 kV. The beam angle mean (BAM) as a function of the extracted beam current was then measured. The BAM is measured as an angle compared to normal to the workpiece. In other words, if a beam is perpendicular to the surface of the workpiece, its BAM is defined as 0°. It was found that the BAM was greater than 30° for beam currents less than about 30 mA. Further, it was found that the BAM was almost 50° at low beam currents (i.e. less than 10 mA).

In a second test, the height of the extraction aperture 130 was varied from 6 mm to 10 mm, and the workpiece support 170 was biased at 2 kV. The beam current in this test was about 18 mA. The beam angle mean (BAM) as a function of extraction aperture height was then measured. It was found that the BAM was greater than 40° for extraction aperture heights of 8 mm or less. Further, it was found that the BAM was almost 40° at an extraction aperture height of 10 mm.

In a third test, the bias voltage applied to the workpiece support 170 was varied from 500V to 3 kV, and the extraction aperture height was set at 6 mm. The beam angle mean (BAM) as a function of extraction voltage was then measured. It was found that the BAM was greater than 40° for extraction voltages of about 1250V or more. Further, it was found that the BAM reduced to less than 30° when the extraction voltage was less than 1 kV.

Thus, by disposing the extraction aperture on the side wall of the hollow ion source, rather than on the second wall, the beam angle mean can be increased by 5-10° relative to other directional processing systems.

Thus, in certain embodiments, such as those shown in FIGS. 1-7, a hollow rectangular ion source is disclosed. The rectangular ion source has four outer walls 121 that define the outer rectangle, a first wall 100 with a first opening 105 in the shape of a smaller rectangle, a second wall 110 with a second opening 115 in the shape of the same smaller rectangle, and interior walls that connect the edges of the first opening 105 with the edges of the second opening 115. The first wall 100 and the second wall 110 each have an outer perimeter that is the same shape as the outer rectangle. The plasma chamber 150 is defined as an enclosed volume between these outer walls 121, interior walls, first wall 100 and second wall 110. Extraction apertures 130 are disposed on at least one of the two opposite interior side walls 125. As described above, the plasma source may be disposed within the volume defined by the outer walls 121, the interior walls, the first wall 100 and the second wall 110. Alternatively, the plasma source may be disposed outside the outer walls 121.

FIG. 8 shows another embodiment of the hollow ion source 12. In this embodiment, the opening on the first wall 800 is larger than the opening on the second wall 810. In certain embodiments, the width of the opening on the first wall 800 is larger than the width of the opening on the second wall 810, while the length of the opening on the first wall 800 is the same dimension as the length of the opening on the second wall 810.

This configuration creates sloped interior side walls 825 that are slanted inward from the first wall 800 allowing the cross-sectional area of the hollow region 840 to be larger near the first wall 800 than at the second wall 810. This configuration may reduce the amount of etching byproducts 610 that are deposited on the sloped interior side walls 825.

In other embodiments, the width of the opening on the first wall 800 is larger than the width of the opening on the second wall 810, and the length of the opening on the first wall 800 is larger than the length of the opening on the second wall 810. This configuration creates sloped interior side walls 825, as described above, and also creates sloped interior end walls. This configuration may reduce the amount of etching byproducts 610 that are deposited on the sloped interior side walls 825 and the sloped interior end walls.

Other aspects of this hollow ion source 12 are the same as those described above. In other words, the plasma chamber 850 is an enclosed volume defined by the sloped interior side walls 825, the first wall 800, the second wall 810, the outer walls 821, and the interior end walls (not shown). The plasma source may be inside the hollow ion source 12, as shown in FIGS. 5A-5B, or outside the hollow ion source 12, as shown in FIG. 4. As shown in FIG. 6, a pump 620 may be disposed within or above the hollow region 840.

Further, note that the extraction aperture 830 is located at the corner of the sloped interior side wall 825 and the second wall 810.

While FIG. 8 shows the sloped interior side walls 825 are being straight, it is understood that the sloped interior side walls 825 may also be curved. For example, the sloped interior side walls 825 may have a concave or convex shape to further reduce the possibility of etching byproducts being deposited on these sloped interior side walls 825.

FIG. 9 shows another embodiment of the hollow ion source 13. In this embodiment, the second wall 910 extends into the hollow region 940 beyond the interior side walls 925. In FIGS. 3A-3B, the interior side walls 125 extend downward toward the second wall 110. Each of the second inner side edges 118 is in the same plane as the respective interior side wall 125. In contrast, in FIG. 9, each of the second inner edges 918 extend beyond the plane of the respective interior side wall 925. This configuration may reduce the amount of etching byproduct that enters the plasma chamber 950 via the extraction aperture 930. The other aspects of this embodiment are as described above with respect to FIGS. 1-7. In other words, the plasma source may be any of those described above. Further, a pump may be disposed within or above the hollow region 940.

While the second wall 910 extends beyond the plane of the respective interior side wall 125, note that the extraction aperture 930 is still disposed at the corner, where the plane of the interior side wall 125 and the second wall 910 intersect.

Figure 10:
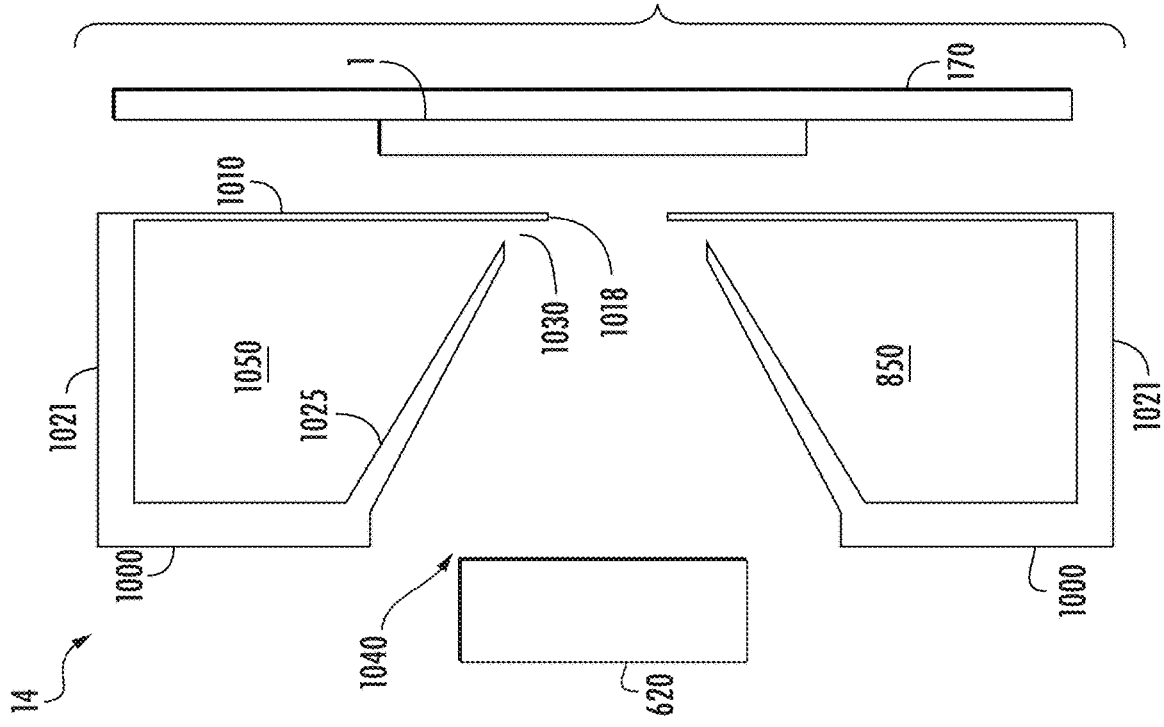
FIG. 10 shows another embodiment of the apparatus for directional processing where the second wall extends into the void.

FIG. 10 shows another embodiment of the hollow ion source 14 having outer walls 1021, first wall 1000, second wall 1010 and sloped interior side wall 1025. In this embodiment, the second wall 1010 extends into the hollow region 1040 beyond the plane of the sloped interior side walls 1025. In FIG. 8, the sloped interior side walls 825 slope toward the second wall 810. Each of the second inner side edges are in the same plane as the respective sloped interior side wall 825. In contrast, in FIG. 10, the sloped interior side walls 1025 extend from the first wall 1000 toward the second wall 1010. Each of the second inner edges 1018 extend beyond the plane of the respective sloped interior side wall 1025. This configuration may reduce the amount of etching byproduct that enters the plasma chamber 1050 via the extraction aperture 1030. The other aspects of this embodiment are as described above with respect to the previous embodiments. In other words, the plasma source may be any of those described above. Further, a pump may be disposed within or above the hollow region 1040.

While the second wall 1010 extends beyond the plane of the respective sloped interior side wall 1025, note that the extraction aperture 1030 is still disposed at the corner, where the plane of the sloped interior side wall 1025 and the second wall 1010 intersect.

While FIG. 10 shows the sloped interior side walls 1025 are being straight, it is understood that the sloped interior side walls 1025 may also be curved. For example, the sloped interior side walls 1025 may have a concave or convex shape to further reduce the possibility of etching byproducts being deposited on these sloped interior side walls 1025.

Note that in all embodiments, the extraction aperture is disposed at a corner of the ion source, where a "corner" is defined as proximate the region where the planes of two walls of the ion source intersect. In other words, in FIGS. 3-7, the intersection of the two planes is formed as an "L" shape. The intersection of the two planes in FIG. 8 is formed as a "V" shape. The intersection of the two planes in FIG. 9 is formed as a "T" shape. The intersection of the two planes in FIG. 10 is formed as a "Y" shape. In each of these embodiments, the extraction aperture is located proximate this intersection.

Further, note that in each of these embodiments, the extraction aperture is disposed on a side wall which connects the first wall and the second wall. The second wall is closest to the workpiece support 170 when in the processing position and may be parallel to the workpiece support 170 when in the processing position. The side wall with the extraction aperture may be perpendicular to the second wall and the surface of the workpiece, as shown in FIGS. 1-7 and 9. In other embodiments, this side wall forms an acute angle with the second wall, as shown in FIGS. 8 and 10. Thus, in all of these embodiments, the ion source comprises a plasma source, a plurality of walls defining a plasma chamber, wherein at least one of these walls comprises an extraction aperture. The wall that has the extraction aperture is either perpendicular to the second wall, or forms an acute angle with the second wall.

Figure 11:
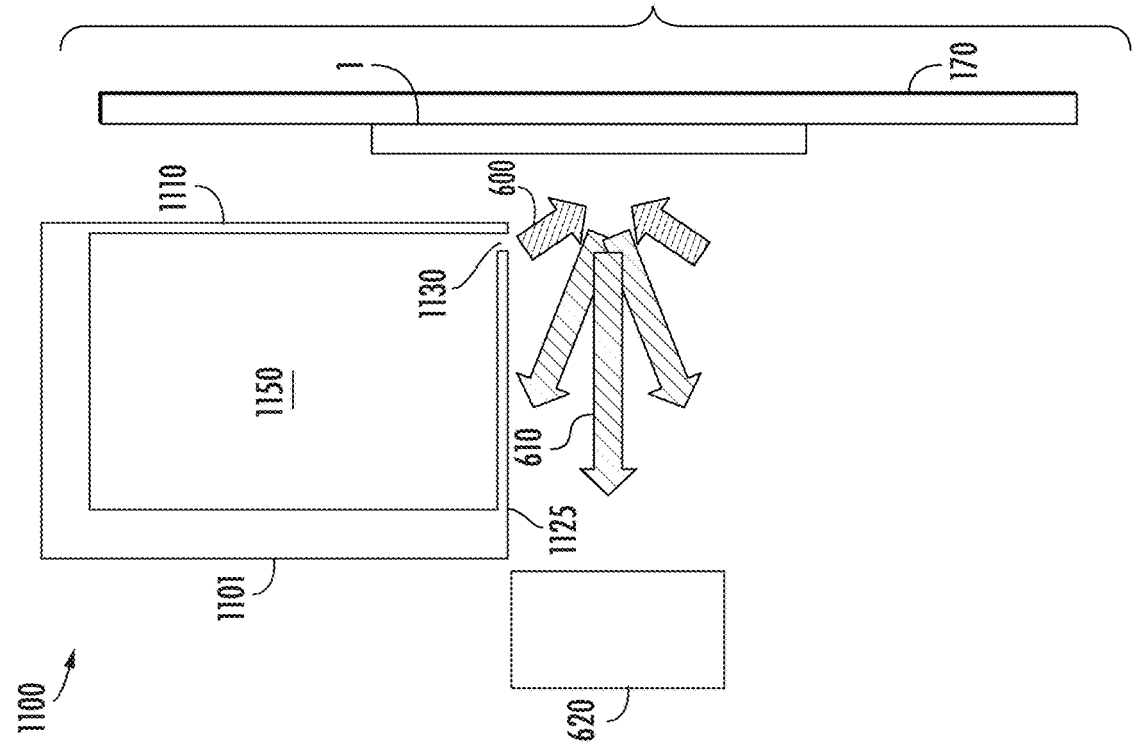
FIG. 11 shows another embodiment of the apparatus for directional processing having a single plasma chamber.

While the previous embodiments all include a hollow region, other embodiments are also possible. For example, FIG. 11 shows an apparatus that includes an ion source 1100 and a workpiece support 170. The ion source 1100 includes a first wall 1101 and a second wall 1110, where the second wall 1110 is the closest to the workpiece support 170 and may be parallel to the workpiece support 170 when in the processing position. The first wall 1101 may be opposite the second wall 1110. Side walls 1125 are used to connect the first wall 1101 to the second wall 1110. These walls form a plasma chamber 1150. The ion source 1100 may include any suitable plasma source, such as, not but limited to, an antenna, as shown in FIG. 4, an internal coil, as shown in FIGS. 5A-5B, an indirectly heated cathode, an electron beam plasma source or a Bernas source.

The extraction aperture T is disposed on one of the side walls 1125. In this embodiment, the extraction aperture 1130 is disposed at the corner of the side wall 1125 and the second wall 1110. Ions 600 are extracted through the extraction aperture 1130 and travel at an angle toward the workpiece 1. In the case of an etching process, the ions 600 may cause etching byproducts 610 to be generated. A sputter catcher or pump 620 may be disposed proximate the side wall 1125 that includes the extraction aperture 1130. This pump 620 is used to pump the etching byproducts 610 away from the workpiece 1.

While FIG. 11 shows the end of the second wall 1110 coinciding with the plane of the side wall 1125, other embodiments are also possible. For example, the second wall 1110 may extend beyond the plane of the side wall 1125, such as is shown in FIG. 9.

Further, in this embodiment, the side wall 1125 that includes the extraction aperture 1130 is perpendicular to the second wall 1110. However, the shape of the ion source may vary.

Figure 12:
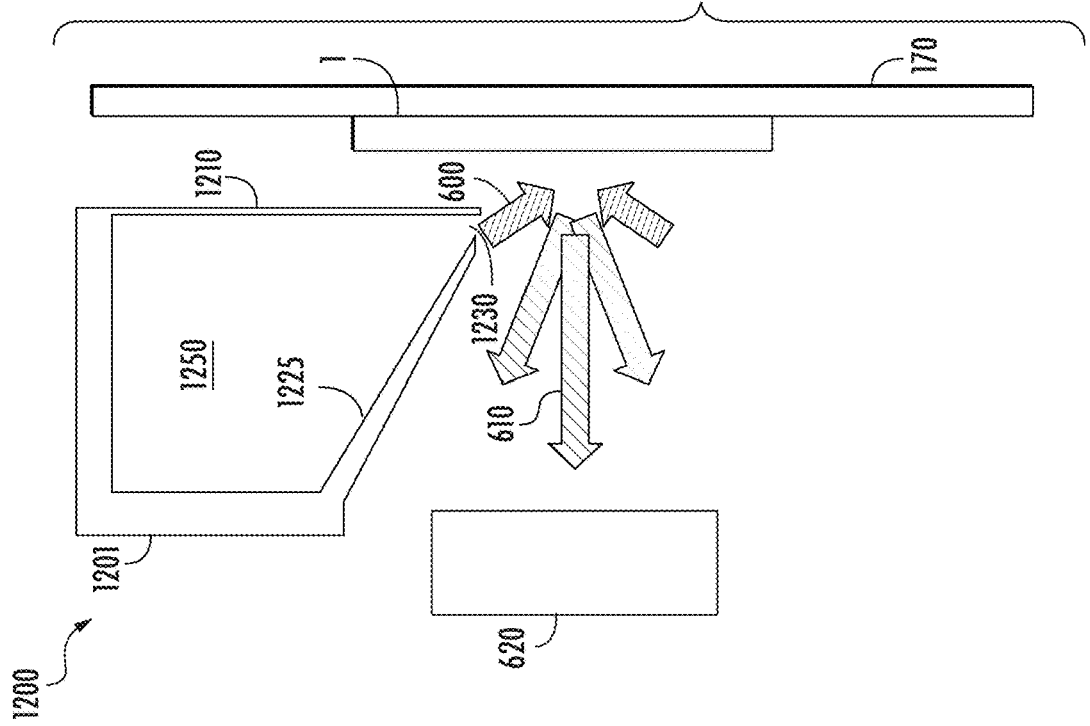
FIG. 12 shows another embodiment of the apparatus for directional processing having a single plasma chamber.

FIG. 12 shows an ion source 1200, where the side wall 1225 forms an acute angle with the second wall 1210. As described above, a first wall 1201 is disposed opposite the second wall 1210, and the side walls 1225 connect the first wall 1201 and the second wall 1210. Further, the second wall 1210 is the closest to the workpiece support 170 and may be parallel to the workpiece support 170 when in the processing position. Again, the extraction aperture 1230 is disposed on a side wall 1225 in the corner. Ions 600 are extracted from the plasma chamber 1250 through the extraction aperture 1230 and travel at an angle toward the workpiece 1. In the case of an etching process, the ions 600 may cause etching byproducts 610 to be generated. A sputter catcher or pump 620 may be disposed proximate the side wall 1225 that includes the extraction aperture 1230. This pump 620 is used to pump the etching byproducts 610 away from the workpiece 1.

Figure 13:
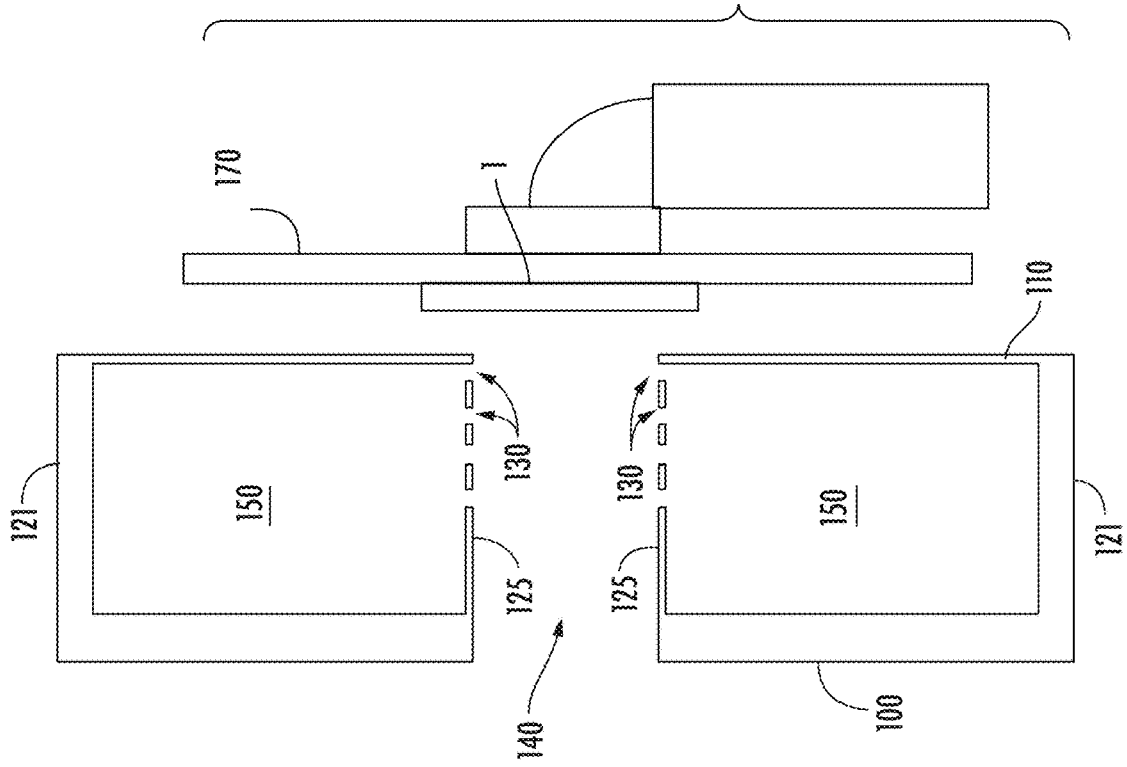
FIG. 13 shows an embodiment of the apparatus for directional processing with multiple extraction apertures on each side wall.

Each of the embodiments described herein show one extraction aperture disposed on a side wall. However, the disclosure is not limited to this embodiment. For example, a plurality of extraction apertures may be formed on one of the interior side walls, as shown in FIG. 13. This may be achieved by forming the interior side wall as a metal plate with a plurality of apertures. In another embodiments, at least a portion of the interior side wall may be a mesh. The use of multiple extraction apertures may be applied to any of the embodiments described herein.

The embodiments described above in the present application may have many advantages. First, the present system allows for directional etching while providing a path of etching byproducts to be removed. This reduces the frequency of preventative maintenance and also insure more consistent etching operating parameters. In other words, because there is a hollow region above the area where the ions are striking the workpiece, the etching byproducts can be evacuated without being deposited on the second wall or any surface of the ion source.

Additionally, the position of the extraction aperture enables larger beam angles than are possible with configurations that include the extraction aperture on the second wall. As described above, the beam angle mean may be greater than 40°. Furthermore, in the embodiments shown in FIGS. 9 and 10, by extending the second wall into the hollow region, the beam angle mean may be greater than 60° and may be as large as 80°.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for performing a directional process on a workpiece, comprising:
    a workpiece support for clamping the workpiece;
        a hollow rectangular ion source having a plurality of walls that defines a plasma chamber wherein outer edges of the ion source define a rectangular prism and the plurality of walls are all planar; and
    a plasma source, wherein the plasma source comprises an antenna or coil to produce an inductively coupled plasma in the plasma chamber;
    wherein the hollow rectangular ion source comprises:
        a first wall comprising a first rectangular opening defined by first inner side edges and first inner end edges;
        a second wall, parallel to the workpiece support, comprising a second rectangular opening defined by second inner side edges and second inner end edges;
        outer walls connecting outer edges of the first wall and the second wall;
        interior end walls connecting the first inner end edges and the second inner end edges such that there are no extraction apertures along the interior end walls; and
        two interior side walls extending from the first inner side edges toward the second wall, wherein at least one of the interior side walls does not extend to the second wall, creating a first extraction aperture disposed between the second wall and a bottom of the interior side wall wherein the interior end walls and the interior side walls define a hollow region of the ion source, and wherein the hollow region defines a path for byproducts to flow away from the workpiece during the directional process.

2. The apparatus of claim 1, wherein an ion beam is extracted through the first extraction aperture to perform the directional process on the workpiece, and wherein a pump or sputter catcher is positioned within or above the hollow region to pump byproducts of the directional process away from the workpiece.

3. The apparatus of claim 1, wherein the first rectangular opening and the second rectangular opening have an equal width, and the interior side walls extend from the first wall toward the second wall in a direction perpendicular to the second wall.

4. The apparatus of claim 1, wherein the first rectangular opening is larger than the second rectangular opening in a width direction, and the interior side walls extend from the first wall toward the second wall in a direction perpendicular to the second wall, and wherein each of the second inner side edges extend beyond a plane of a respective interior side wall.

5. The apparatus of claim 1, wherein the first rectangular opening is larger than the second rectangular opening in a width direction and the interior side walls slope inward from the first inner side edges toward the second wall to further minimize redeposition of byproducts of the directional process on the interior side walls.

6. The apparatus of claim 5, wherein each of the second inner side edges extend beyond a plane of a respective interior side wall.

7. The apparatus of claim 1, wherein the two interior side walls do not extend to the second wall, such that there is a second extraction aperture, arranged parallel to the first extraction aperture and disposed proximate the hollow region so as to create two ion beams.

8. An apparatus for performing a directional process on a workpiece, comprising:
    a workpiece support for clamping the workpiece;
    an ion source comprising a plurality of walls defining a plasma chamber, and an extraction aperture; and
    a plasma source, wherein the plasma source comprises an antenna or coil to produce an inductively coupled plasma in the plasma chamber;
    wherein the plurality of walls comprises a first wall and a second wall, wherein the first wall is opposite the second wall, and the second wall is disposed closest to and parallel to the workpiece support in a processing position, and a plurality of planar side walls connecting the first wall and the second wall, wherein one of the planar side walls extends from the first wall toward the second wall but does not extend to the second wall, creating the extraction aperture and wherein there are no other extraction apertures.

9. The apparatus of claim 8, wherein the planar side wall that includes the extraction aperture is perpendicular to the second wall.

10. The apparatus of claim 8, wherein the planar side wall that includes the extraction aperture forms an acute angle with the second wall.

11. The apparatus of claim 8, wherein the second wall extends beyond the planar side wall that includes the extraction aperture.

12. The apparatus of claim 8, wherein a pump or sputter catcher is disposed proximate the planar side wall that includes the extraction aperture.

13. An apparatus for performing a directional process on a workpiece, comprising:
    a workpiece support;
    an ion source having a plurality of walls that define a plasma chamber; and
    a plasma source, wherein the plasma source comprises an antenna or coil to produce an inductively coupled plasma in the plasma chamber;
    wherein the plurality of walls includes a first wall;
        a second wall proximate and parallel to the workpiece support when the workpiece support is in a processing position; and
    a plurality of sidewalls disposed between the first wall and the second wall, including interior end walls and two interior side walls, wherein the interior end walls extend from the first wall to the second wall and the two interior side walls extend from the first wall toward the second wall but do not extend to the second wall so as to create two extraction apertures;
    wherein planes of the second wall and each of the two interior side walls meet in a line, the line referred to as a corner and wherein the two extraction apertures are positioned at corners of the plasma chamber proximate the workpiece support in the processing position and wherein the lines that define the corners where the two extraction apertures are positioned are parallel to each other.

14. The apparatus of claim 13, wherein placement of the two extraction apertures at the corners of the plasma chamber allows a path for byproducts to flow away from the workpiece positioned on the workpiece support in the processing position.

15. The apparatus of claim 13, wherein an ion beam is extracted through the two extraction apertures to perform the directional process on the workpiece, and wherein a pump is positioned proximate the corner of the plasma chamber to pump byproducts of the directional process away from the workpiece.

16. The apparatus of claim 13, wherein an ion beam is extracted through the two extraction apertures and where the directional process is an etching process that creates etching byproducts from the workpiece.

17. The apparatus of claim 16, further comprising a pump to pump the etching byproducts away from the workpiece along a path created by the two extraction apertures positioned at the corner of the plasma chamber.

* * * * *